United States Patent [19]

Storer

[11] Patent Number: 4,918,560
[45] Date of Patent: Apr. 17, 1990

[54] PROXIMITY OPERATED MACHINE CONTROL

[76] Inventor: Roy R. Storer, 303 Townline-Kossuth Rd., St. Marys, Ohio 45885

[21] Appl. No.: 225,833

[22] Filed: Jul. 29, 1988

[51] Int. Cl.$^4$ .............................................. H01H 9/00
[52] U.S. Cl. ..................................... 361/190; 307/113
[58] Field of Search ......................... 361/189, 190 X; 307/112, 113, 114, 115, 116, 119

[56] References Cited

U.S. PATENT DOCUMENTS

| | | | |
|---|---|---|---|
| 3,406,802 | 10/1968 | Needham et al. | 361/189 |
| 3,641,410 | 2/1972 | Vogelsber | 318/345 |
| 3,748,541 | 7/1973 | Ginsberg | 307/113 |
| 3,793,533 | 2/1974 | Ginsberg | 307/113 |
| 3,805,085 | 4/1974 | Andrews | 307/115 |
| 3,805,086 | 4/1974 | Larson et al. | 307/116 |
| 3,895,269 | 7/1975 | Geremia | 361/187 |
| 3,914,621 | 10/1975 | Passarelli, Jr. | 307/113 |
| 4,091,438 | 5/1978 | Olding et al. | 361/189 |
| 4,120,389 | 10/1978 | Erickson | 192/129 A |
| 4,412,268 | 10/1983 | Dassow | 361/181 |
| 4,419,646 | 12/1983 | Hermle | 361/142 |
| 4,757,213 | 7/1988 | Tiggs et al. | 307/115 |

Primary Examiner—A. D. Pellinen
Assistant Examiner—Jeffrey A. Gaffin

[57] ABSTRACT

A machine control system for electrically-operated apparatus wherein the operator's hands must be located upon separate spaced switches before the machine functions. The switches are of the proximity type to sense the presence of the operator's hand upon the hand being brought within a predetermined distance from the associated switch, and each switch apparatus employs yieldable force resistance means, such as an elastic diaphragm, to provide slight resistance to the movement of the operator's hand toward said predetermined distance, but does not require such force as to produce medical problems, such as carpal tunnel syndrome.

9 Claims, 1 Drawing Sheet

PROXIMITY OPERATED MACHINE CONTROL

BACKGROUND OF THE INVENTION

Electrically-operated industrial machines whose operation may be hazardous to the safety of the operator, such as punch and forming presses, have long utilized a safety control system wherein two hand-operated switches are connected in series such that both switches must be simultaneously actuated in order to energize the machine. As the switches are separated by several feet they cannot be simultaneously operated by one hand requiring the use of both of the operator's hands for actuation and thereby insuring that the work area is cleared and the machine may be safely operated. Typical examples of such machine controls are shown in U.S. Pat. Nos. 3,895,269 and 4,054,935.

Safety switches of this type are usually operated by the operator's palm and are of the spring-biased type wherein it is necessary for the operator to depress the switch actuator and maintain the actuator depressed during machine operation. The force required to operate such safety switches when done repetitiously hundreds of times during a work shift is sufficient to produce physical problems in the hand, wrist and arms of the operators resulting in substantial workmen compensation claims. The most typical ailment resulting from such switch operation is carpal tunnel syndrome occurring in the operator's hands, and as such maladies can be directly attributed to work-related activities very high compensation costs have been experienced due to this problem.

To avoid carpal tunnel syndrome, and similar safety switch related physical problems, light beam type switches and touch plate switches have been utilized. For instance, U.S. Pat. No. 4,412,268 discloses a touch plate switch system to lower the risk of carpal tunnel syndrome. However, such light-operated and touch plate or proximity-operated switch systems do not comply with governmental requirements which require that this type of safety switch must have some resistance to switch actuation in order to prevent inadvertent switch operation, or intentional switch actuation by the operator by placing a weight or obstruction on the switch to bypass the intended two-hand operation.

It is the object of the invention to provide a safety switch system for electrically-operated machines wherein the control circuit employs two series-connected switches sensing the proximity of portions of the operator's hand to sensing means, and employs minimal force resistance means to meet governmental standards and requirements, and yet avoids operator maladies due to switch operation.

Another object of the invention is to provide a safety switch system for electrically-operated industrial machines wherein the switch is of the proximity type and the sensor is shielded by a recess closed by a deformable elastic shield which must be deformed when locating a portion of the operator's hand within the operative distance of the switch sensor.

Yet a further object of the invention is to provide a safety switch system for electrically-operated industrial machines wherein the switches employ proximity sensing means and access to the sensing means is protected by an elastic diaphragm requiring deformation by the operator's hand to locate a hand portion within the switch sensing range.

In the practice of the invention the two switch devices used are identical in construction and the switches are sufficiently separated, such as by 24 inches, to prevent simultaneous operation by a single hand. Thus, simultaneous operation of both switches requires both hands insuring that the machine work area being operated by the switches is cleared of the operator's hands. In those instances where several operators may be simultaneously loading or unloading a punch press or the like, each operator will be required to operate a pair of switches before the equipment cycles.

The switch includes a tubular neck or the like which defines an access recess having an inner end and an outer end. Sensing means are located at the recess inner end which sense the presence of the operator's hand, such as a palm, or finger, as soon as the same is brought within a predetermined distance of the sensing means through the sensing means access as defined by the switch recess.

The outer end of the recess is enclosed by an elastic diaphragm formed of rubber or the like, which is readily deformable but requires a minimal force to produce deformation. Thus, the operator may not locate a hand portion within the sensing range of a switch sensor without deforming the diaphragm whereby insuring that sufficient "resistance" to switch actuation is required to comply with governmental regulations.

The force required to deform the diaphragm is not sufficient to produce physical maladies in the operator's hand and the diaphragm further functions to prevent the entry of foreign matter into the switch access. Such a switch is capable of dependable operation in an adverse environment for an extended duration, and yet the cost of producing the switch is relatively low.

BRIEF DESCRIPTION OF THE DRAWINGS

The aforementioned objects and advantages of the invention will be appreciated from the following description and accompanying drawings wherein.

DESCRIPTION OF THE PREFERRED EMBODIMENT

Figure 1:
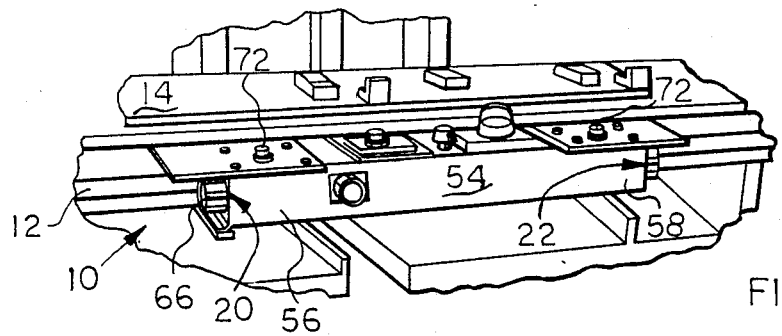
FIG. 1 is a perspective view of a typical safety switch installation utilizing the concepts of the invention.
Figure 2:
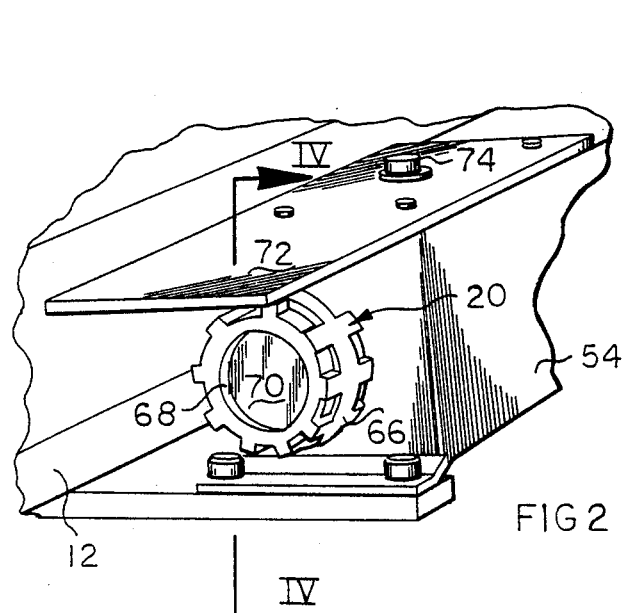
FIG. 2 is an enlarged, detail, perspective view of a single safety switch.

A typical installation of a machine safety switch control in accord with the invention is illustrated in FIG. 1 wherein a portion of a machine tool generally indicated at 10 is illustrated. The machine tool 10 will include a bed 12, and as this type of machine control is usually employed with presses the press will include lower die structure schematically illustrated at 14, and the apparatus includes an upper platen having an upper die, not shown, which is lowered into engagement with the lower die 14 so as to form a workpiece inserted therebetween.

Control of lowering of the upper platen and die is through electrically-operated structure which may be of a mechanical clutch type, or may consist of a hydraulically-driven unit controlled by solenoid-type valves, not shown, as well known in the art.

Figure 5:
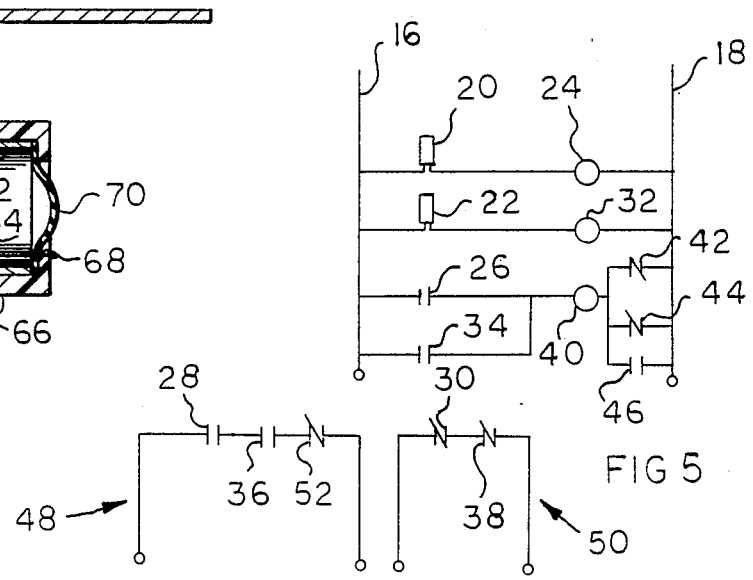
FIG. 5 is a typical electrical circuit diagram of the control circuit used with the switches of the invention.

A typical basic electrical circuit in which the switches of the invention are utilized is shown in FIG. 5. 16 and 18 represent power lines, and the first control switch is shown at 20, while the second switch is at 22. Switch 20 controls relay 24 for closing contacts 26 and 28 and closing contacts 30 while switch 22 operates relay 32 to close contacts 34 and 36 and open contacts 38. A timer relay 40 is included in the circuit energized by contacts 26 and 34 which are in parallel with the timer, and the timer is connected to line 18 through normally closed contacts 42 of relay 24 and contacts 44 of relay 32. Also, the timer circuit includes the normally open contacts 46 operated by timer relay 40.

The machine control includes the sub-circuits 48 and 50 wherein contacts 28 of relay 24 and contacts 36 of relay 32 are in series with the normally closed timer-controlled contact 52. Also, sub-circuit 50 includes normally closed contacts 30 of relay 24 and normally closed contacts 38 of relay 32.

The switches 20 and 22 must be closed within one second of each other in order to maintain the timer contacts 46 closed. Otherwise, the contacts 46 will open. The sub-circuits 48 and 50 control the operation of the press, and the press upper platen and die will only close upon the switches 20 and 22 being activated by the separate hands of the operator.

With a press or machine tool utilizing a plurality of operators similar circuits are utilized with each operator so that each operator must be depressing safety switches with separate hands to permit the machine tool to function thereby insuring that none of the operator's hands are in a dangerous position.

The switch apparatus is located between the operator, not shown, and the press dies, and may be of a variety of configurations. The switch housing and associated structure shown in the drawings are only illustrating of one type of installation.

In the illustrated embodiment an elongated housing 54 is attached to the machine tool 10 at the desired location and the housing includes a left end region 56 and a right end region 58, FIG. 1. The switch 20 is mounted within the end region 56 while the switch 22 is located within the end region 58 of the housing 54, and as later described, each of the switches consists of a plurality of components. As the switches 20 and 22 are identical in construction only one switch will be described in detail.

Each switch 20 and 22 includes a proximity sensor 60 capable of sensing the presence of a portion of the human hand. The particular construction and operation of the sensor 60 is not subject matter of the instant invention, and the sensor may be of the impedance, infrared, light-sensing, heat-sensing, or other for detecting the presence of the operator's palm, finger or the like within a predetermined distance from the sensor.

Each switch also includes an access to the associated sensor 60 which is defined by a tubular extension 62 forming a cylindrical access recess 64. The tubular extension 62 includes an outer cylindrical surface upon which the diaphragm-mounting cap 66 is located, and the exterior of the tubular extension may include threads or other means for attaching the cap to the extension.

Figure 4:
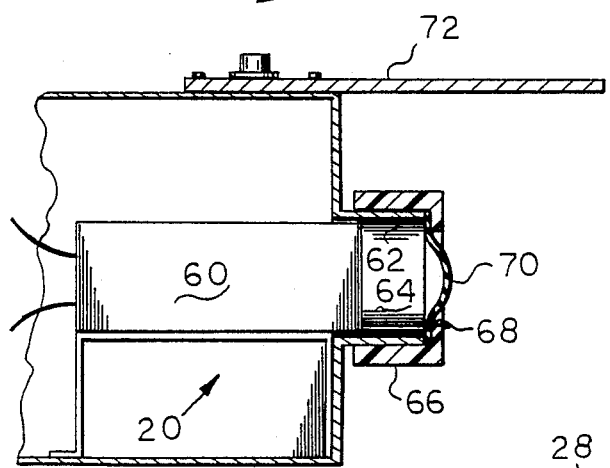
FIG. 4 is a diametrical sectional view of a switch constructed in accord with the invention, as taken along Section IV—IV of FIG. 2.

The cap 66 may be formed of a synthetic plastic material and includes an inwardly extending lip 68, FIG. 4, which maintains the resilient and deformable diaphragm 70 across the outer end of the recess 64. The diaphragm 70 may be bonded or otherwise attached at its periphery to the cap lip 68, or may be compressed between the end of the extension and the cap lip. The cap may either be threaded on the exterior of the extension or may be chemically bonded thereto, and the diaphragm 70 will close the outer end of the sensor access recess 64 preventing the entrance of foreign matter, and preventing a portion of the operator's hand from entering the recess unless the rubber diaphragm is inwardly deformed against its inherent resiliency. The diaphragm 70 may be formed of rubber or similar resilient material. However, it is to be understood that the diaphragm is of a light weight and the force required to inwardly displace and deform the diaphragm is slight.

Figure 3:
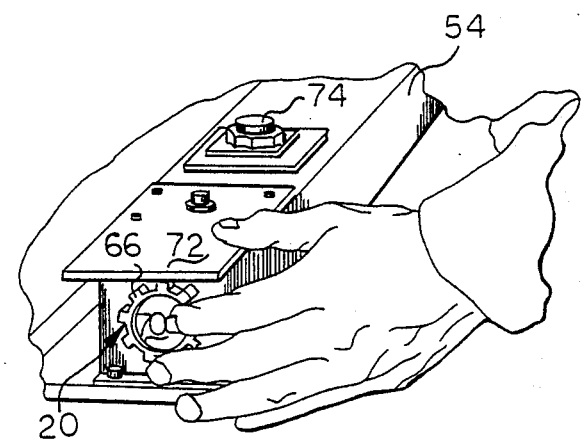
FIG. 3 is a detail, perspective view of the safety switch being operated by the operator's finger.

The housing 54 preferably includes shields 72 attached to the upper surface of the housing end regions which extend over the caps 66 requiring that the operator's hands be inserted horizontally under the shields for encountering the diaphragms 70, as will be apparent from FIG. 3.

By locating the operator's hands relative to the switches 20 and 22, as will be apparent in FIG. 3, wherein the operator's hand relative to the switch 20 is illustrated, the operator may use the end of a finger, or fingers, to engage the diaphragm 70 and deform the diaphragm inwardly toward the sensor 60 sufficiently to bring the end of the finger within the sensor's predetermined distance permitting the sensor to determine the presence of the finger and activate the associated switch. Upon both of the operator's hands deforming the associated diaphragms of the switches 20 and 22 the machine will operate to close the press dies and perform the desired function.

An indicator light 74 may be located upon the switch housing for indicating particular phases of the operation cycle. For instance, the light 74 may be used to indicate a malfunction or the simultaneous closing and actuation of the switches.

The primary purpose of the resilient diaphragm 70 is to meet safety requirements wherein it is necessary that the machine control switches produce a predetermined resistance to switch operation. Governmental agencies require a certain degree of resistance to this type of safety switch operation, and the diaphragm produces this resistance to qualify this machine safety control system under rules of the Occupational Safety and Health Administration.

The use of the diaphragms, because the diaphragms can be adequately deformed with the exertion of only slight pressure, eliminates carpal tunnel syndrome of the hands of the operators of machines using this type of switch system, and apparatus in accord with the invention achieves the aforestated objects and advantages.

It is understood that various modifications to the inventive concepts may be apparent to those skilled in the art without departing from the spirit and scope of the invention.

I claim:

1. A machine control for electrically-operated machines having a machine control circuit wherein the circuit includes a pair of electrical switches connected in series whereby both switches must be simultaneously closed to energize the machine, the improvement comprising, in combination, first and second switches connected in series included in the machine control circuit, at least one of said switches including proximity sensing means for sensing the presence of an operator upon the operator locating a hand portion within a predetermined distance of said sensing means, an access to said sensing means defined on the associated switch, and yieldable force resistance means located within said access accessible to the operator's hand whereby said force resistance means must be overcome by the operator's hand to locate the hand within said predetermined distance of said sensing means.

2. In a machine control for electrically-operated machines as in claim 1, both said first and second switches including proximity sensing means, an access and yieldable force resistance means located within the associated access of each switch.

3. In a machine control for electrically-operated machines as in claim 1, said yieldable force resistance means comprising resilient means.

4. In a machine control for electrically-operated machines as in claim 3, said resilient means comprising an elastic diaphragm located within said access.

5. In a machine control for electrically-operated machines as in claim 4, said access comprising a recess having an inner end and an outer end, said proximity sensing means being located adjacent said recess inner end, said elastic diaphragm enclosing said recess outer end.

6. In a machine control for electrically-operated machines as in claim 5, said recess outer end including diaphragm attachment means, said diaphragm including a periphery and a central region, said diaphragm periphery being attached to said attachment means and said central region being resiliently deformable by the operator's hand toward said sensing means.

7. A machine control for electrically-operated machines having a machine control circuit wherein the circuit includes a pair of electrical switches connected in series whereby both switches must be simultaneously closed to energize the machine, the improvement comprising, in combination, first and second switches connected in series included in the machine control circuit, each of said switches including a recess having an inner end and an outer end, proximity sensing means located adjacent said recess inner end for sensing the presence of an operator upon the operator locating a hand portion within a predetermined distance of said sensing means, and an elastic diaphragm extending across each recess outer end elastically deformable by an operator's hand portion to locate the operator's hand portion within said predetermined distance to activate the associated sensing means.

8. In a machine control for electrically-operated machines as in claim 7, said recess outer end including diaphragm attachment means, said diaphragm including a periphery and a central region, said diaphragm periphery being attached to said attachment means and said central region being resiliently deformable by the operator's hand toward said sensing means.

9. In a machine control for electrically-operated machines as in claim 8, said elastic diaphragm being formed of rubber.

* * * * *

UNITED STATES PATENT OFFICE
CERTIFICATE OF CORRECTION

Patent No. 4,918,560      Dated April 17, 1990

Inventor(s) Roy R. Storer

It is certified that error appears in the above-identified patent and that said Letters Patent is hereby corrected as shown below:

On the title page of the patent insert the following information:

--[73] Assignee: Harvard Industries, Inc.
Jackson, Michigan--.

Signed and Sealed this

Ninth Day of July, 1991

Attest:

HARRY F. MANBECK, JR.

*Attesting Officer*     Commissioner of Patents and Trademarks